(12) United States Patent
Tominaga

(10) Patent No.: US 11,540,397 B2
(45) Date of Patent: Dec. 27, 2022

(54) PRINTED SUBSTRATE FORMING METHOD

(71) Applicant: FUJI CORPORATION, Chiryu (JP)

(72) Inventor: Ryojiro Tominaga, Okazaki (JP)

(73) Assignee: FUJI CORPORATION, Chiryu (JP)

( * ) Notice: Subject to any disclaimer, the term of this patent is extended or adjusted under 35 U.S.C. 154(b) by 29 days.

(21) Appl. No.: 16/981,079

(22) PCT Filed: Apr. 12, 2018

(86) PCT No.: PCT/JP2018/015318
§ 371 (c)(1),
(2) Date: Sep. 15, 2020

(87) PCT Pub. No.: WO2019/198190
PCT Pub. Date: Oct. 17, 2019

(65) Prior Publication Data
US 2021/0029832 A1 Jan. 28, 2021

(51) Int. Cl.
*H05K 3/12* (2006.01)
*H05K 3/22* (2006.01)

(52) U.S. Cl.
CPC ........... *H05K 3/1291* (2013.01); *H05K 3/125* (2013.01); *H05K 3/22* (2013.01)

(58) Field of Classification Search
CPC ......... H05K 3/1291; H05K 3/125; H05K 3/22
USPC ...................................................... 427/97.3
See application file for complete search history.

(56) References Cited

U.S. PATENT DOCUMENTS

| | | | | |
|---|---|---|---|---|
| 2004/0245648 A1* | 12/2004 | Nagasawa | ................... | C09J 5/06 257/772 |
| 2015/0092356 A1* | 4/2015 | Yoshikawa | .......... | H05K 3/4007 174/258 |
| 2016/0021759 A1* | 1/2016 | Furutani | .............. | H05K 1/0296 174/251 |
| 2016/0234932 A1* | 8/2016 | Oshima | ................ | H05K 3/4682 |

FOREIGN PATENT DOCUMENTS

| | | |
|---|---|---|
| JP | 62-252192 A | 11/1987 |
| JP | 2006-59942 A | 3/2006 |
| JP | 2016-197624 A | 11/2016 |
| WO | WO 2013/046442 A1 | 4/2013 |

OTHER PUBLICATIONS

International Search Report dated Jun. 19, 2018 in PCT/JP2018/015318 filed on April 12, 2018, 1 page.

\* cited by examiner

*Primary Examiner* — Brian K Talbot
(74) *Attorney, Agent, or Firm* — Oblon, McClelland, Maier & Neustadt, L.L.P.

(57) ABSTRACT

A printed substrate forming method includes: a resin layer forming step of forming a resin layer with curable resin in a specific region that is a region other than a predetermined region of a base which is composed of an insulating layer and a conductor layer, the predetermined region of which being a region on which a solder resist is formed; and a wiring forming step of forming a wiring by discharging metal-containing liquid which contains metal fine particles onto a top surface of the resin layer, and firing the metal-containing liquid.

6 Claims, 7 Drawing Sheets

PRINTED SUBSTRATE FORMING METHOD

TECHNICAL FIELD

The present application relates to a method of forming a printed substrate that includes a base composed of an insulating layer and a conductor layer, and a forming device.

BACKGROUND ART

As disclosed in the Patent Literature below, in a general printed substrate, a solder resist is formed on an upper surface of a base composed of an insulating layer and a conductor layer.

Patent Literature

PTL 1: JP-A-2006-59942

BRIEF SUMMARY

Technical Problem

For example, the solder resist is formed on the upper surface of the base, such as an inner layer circuit board or the like, with using a mask, but even when only a part of the circuit pattern needs to be changed, a new mask is required for being made, which is not practical manner. Therefore, it is an object to provide a printed substrate forming method and the like with high practicality.

Solution to Problem

In order to solve the problems described above, the present description discloses a printed substrate forming method that includes: a resin layer forming step of forming a resin layer with curable resin in a specific region that is a region other than a predetermined region of a base which is composed of an insulating layer and a conductor layer, the predetermined region of which being a region on which a solder resist is formed; and a wiring forming step of forming a wiring by discharging metal-containing liquid which contains metal fine particles onto a top surface of the resin layer, and firing the metal-containing liquid.

In addition, in order to solve the above-described problems, the present description discloses a printed circuit board forming device that includes: a resin layer forming device configured to form a resin layer by curable resin in a specific region which is a region other than a predetermined region of an inner layer circuit board, where the inner layer circuit board is composed of an insulating layer and a conductor layer and a solder resist is formed on the predetermined region of the inner layer circuit board; and a wiring forming device configured to form a wiring by discharging metal-containing liquid which contains metal fine particles onto a top surface of the resin layer, and firing the metal-containing liquid.

Advantageous Effects

According to the present disclosure, a part of the printed substrate is formed of, for example, curable resin discharged by an inkjet head or the like. In this way, it is possible to change a part of the printed substrate easily, and thus, the practicality is improved.

DESCRIPTION OF EMBODIMENTS

Figure 1:
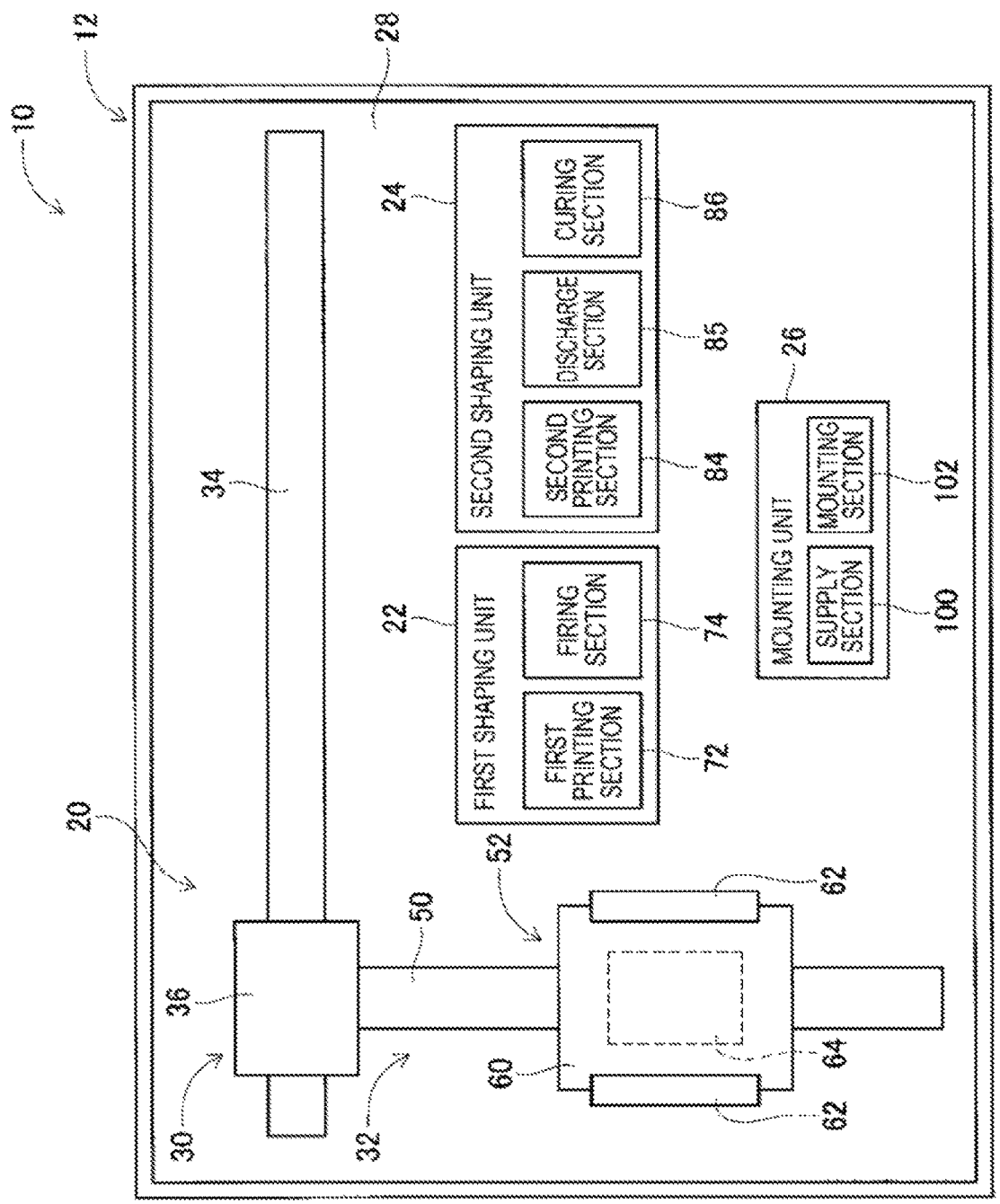
FIG. 1 is a diagram illustrating a custom section forming device.
Figure 2:
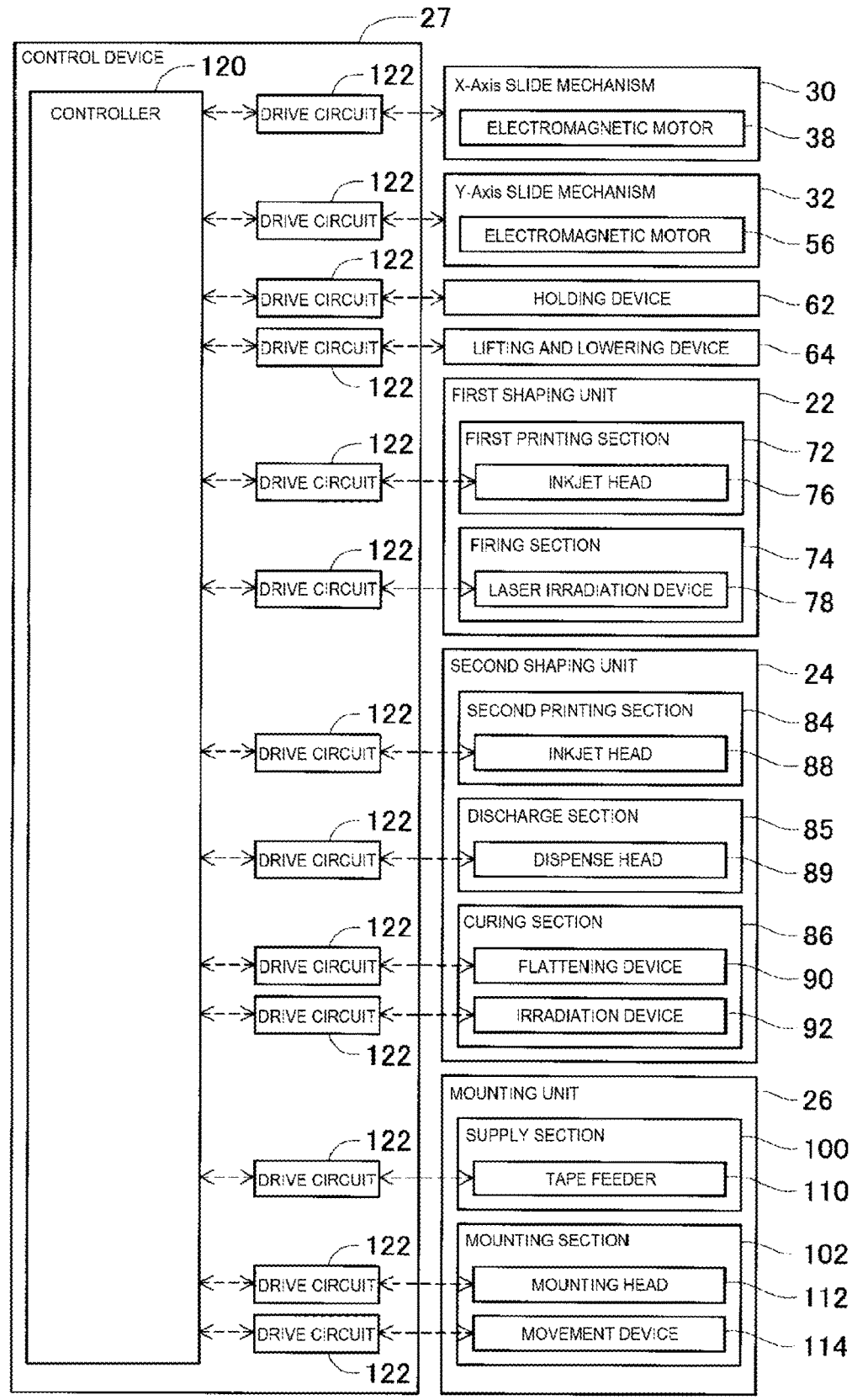
FIG. 2 is a block diagram illustrating a control device.

FIG. 1 and FIG. 2 illustrate circuit forming system 10. Circuit forming system 10 is configured with custom section forming device 12 illustrated in FIG. 1 and general-purpose section forming device 14 illustrated in FIG. 3

Custom section forming device 12 is a so-called 3D printer, and includes conveyance device 20, first shaping unit 22, second shaping unit 24, mounting unit 26, and control device (refer to FIG. 2) 27. Conveyance device 20, first shaping unit 22, second shaping unit 24, and mounting unit 26 are arranged on base 28 of custom section forming device 12. Base 28 has a substantially rectangular shape, and in the following description, the longitudinal direction of base 28 will be referred to as the X-axis direction, the lateral direction of base 28 will be referred to as the Y-axis direction, and the direction orthogonal to both the X-axis direction and the Y-axis direction will be referred to as the Z-axis direction.

Conveyance device 20 includes X-axis slide mechanism 30 and Y-axis slide mechanism 32. X-axis slide mechanism 30 includes X-axis slide rail 34 and X-axis slider 36. X-axis slide rail 34 is disposed on base 28 so as to extend in the X-axis direction. X-axis slider 36 is held by X-axis slide rail 34 so as to be slidable in the X-axis direction. Furthermore, X-axis slide mechanism 30 includes electromagnetic motor (refer to FIG. 2) 38, and by driving electromagnetic motor 38, X-axis slider 36 moves to any position in the X-axis direction. Y-axis slide mechanism 32 includes Y-axis slide rail 50 and stage 52. Y-axis slide rail 50 is disposed on base 28 so as to extend in the Y-axis direction and is movable in the X-axis direction. One end of Y-axis slide rail 50 is coupled to X-axis slider 36. On Y-axis slide rail 50, stage 52 is held so as to be slidable in the Y-axis direction. Furthermore, Y-axis slide mechanism 32 includes electromagnetic motor (refer to FIG. 2) 56, and by driving electromagnetic motor 56, stage 52 moves to any position in the Y-axis direction. As a result, by driving X-axis slide mechanism 30 and Y-axis slide mechanism 32, stage 52 is moved to any position on base 28.

Stage 52 includes base plate 60, holding device 62, and lifting and lowering device 64. Base plate 60 is formed on a flat plate shape, and the printed substrate is placed on the upper surface. Holding devices 62 are provided on both sides of base plate 60 in the X-axis direction. Both edges of the printed substrate in the X-axis direction placed on base plate 60 are pinched by holding device 62, the printed substrate is fixedly held. In addition, lifting and lowering device 64 is disposed below base plate 60, and lifts and lowers base plate 60.

First shaping unit 22 is a unit for shaping a wiring on the printed substrate placed on base plate 60 of stage 52, and includes first printing section 72 and firing section 74. First printing section 72 includes inkjet head (refer to FIG. 2) 76, and inkjet head 76 discharges metal ink in a line shape. The metal ink is ink in which fine metal particles are dispersed in a solvent. Inkjet head 76 discharges the metal ink from multiple nozzles by a piezo type using a piezoelectric element, for example.

Firing section 74 includes laser irradiation device (refer to FIG. 2) 78. Laser irradiation device 78 is a device for causing the discharged metal ink to be irradiated with laser, and the metal ink irradiated with the laser is fired to form the wiring. Firing of the metal ink is a phenomenon in which conductivity is increased by vaporizing solvent or decomposing a metal fine particle protective film by applying energy and contacting or fusing the metal fine particles. Then, by the metal ink being fired, the metal wiring is formed. In addition, the ink firing may be performed by a collective heating method at a temperature at which necessary energy can be applied without using a laser.

In addition, second shaping unit 24 is a unit for shaping a resin layer on the printed substrate placed on base plate 60 of stage 52, and includes second printing section 84, discharge section 85, and curing section 86. The second printing section 84 includes inkjet head (refer to FIG. 2) 88, and inkjet head 88 discharges UV curable resin. The UV curable resin is resin that is cured by being irradiated with the ultraviolet rays. The inkjet head 88 may be, for example, a piezo type using the piezoelectric element, or may be a thermal type in which the resin is heated to generate bubbles which is discharged from multiple nozzles.

Discharge section 85 includes dispense head (refer to FIG. 2) 89, and dispense head 89 discharges the conductive UV curable resin. The conductive UV curable resin is the resin on which the metal fine particles are dispersed on the resin cured by being irradiated with the ultraviolet rays. Then, the resin is cured and shrinks by being irradiated with the ultraviolet rays, the metal fine particles are brought into close contact with each other, and the conductive UV curable resin exhibits the conductivity. Since a viscosity of the conductive UV curable resin is relatively high compared to that of the metal ink, dispense head 89 discharges the conductive UV curable resin from one nozzle having a diameter larger than the diameter of the nozzle of inkjet head 76. Dispense head 89 may be, for example, a transfer head that performs a paste-transfer with a stamp, and the conductive UV curable resin may be, for example, conductive thermosetting resin.

Curing section 86 includes flattening device (refer to FIG. 2) 90 and irradiation device (refer to FIG. 2) 92. Flattening device 90 is for flattening the upper surface of the UV curable resin discharged by inkjet head 88, and for example, by scraping off the excess resin with a roller or a blade while leveling the top surface of the UV curable resin, a thickness of the UV curable resin is uniformed. In addition, irradiation device 92 includes a mercury lamp or an LED as a light source, and causes the discharged UV curable resin or the conductive UV curable resin to be irradiated with the ultraviolet rays. In this way, the discharged UV curable resin is cured to form the resin layer, and the conductive UV curable resin is cured to form the wiring.

Mounting unit 26 is a unit for mounting the electronic components on the printed substrate placed on base plate 60 of stage 52, and includes supply section 100 and mounting section 102. Supply section 100 includes multiple tape feeders (refer to FIG. 2) 110 for feeding the taped electronic components one by one, and supplies the electronic components to the supply position. Not limited to tape feeder 110, supply section 100 may be a tray-type supply device that picks up and supplies the electronic components from the tray. Furthermore, supply section 100 may be configured to include both the tape type and the tray type, or other type of supply device.

Mounting section 102 includes mounting head (refer to FIG. 2) 112 and movement device (refer to FIG. 2) 114. Mounting head 112 includes a suction nozzle (not illustrated) for picking up and holding the electronic component. The suction nozzle is supplied with a negative pressure from a positive and negative pressure supply device (not illustrated), and then, picks up and holds the electronic component by suction of air. Then, by a slight positive pressure being supplied from the positive and negative pressure supply device, the electronic component is separated. In addition, movement device 114 moves mounting head 112 between the supply position of the electronic component by tape feeder 110 and the printed substrate placed on base plate 60. As a result, in mounting section 102, the electronic component supplied from tape feeder 110 is held by the suction nozzle, and the electronic component held by the suction nozzle is mounted on the printed substrate.

As illustrated in FIG. 2, control device 27 includes controller 120 and multiple drive circuits 122. Multiple drive circuits 122 are respectively connected to electromagnetic motors 38 and 56, holding device 62, lifting and lowering device 64, inkjet head 76, laser irradiation device 78, inkjet head 88, dispense head 89, flattening device 90, irradiation device 92, tape feeder 110, mounting head 112, and movement device 114. Controller 120 includes a CPU, a ROM, a RAM, and the like and is mainly a computer, and is connected to multiple drive circuits 122. As a result, the operations of conveyance device 20, first shaping unit 22, second shaping unit 24, and mounting unit 26 are controlled by controller 120.

Figure 3:
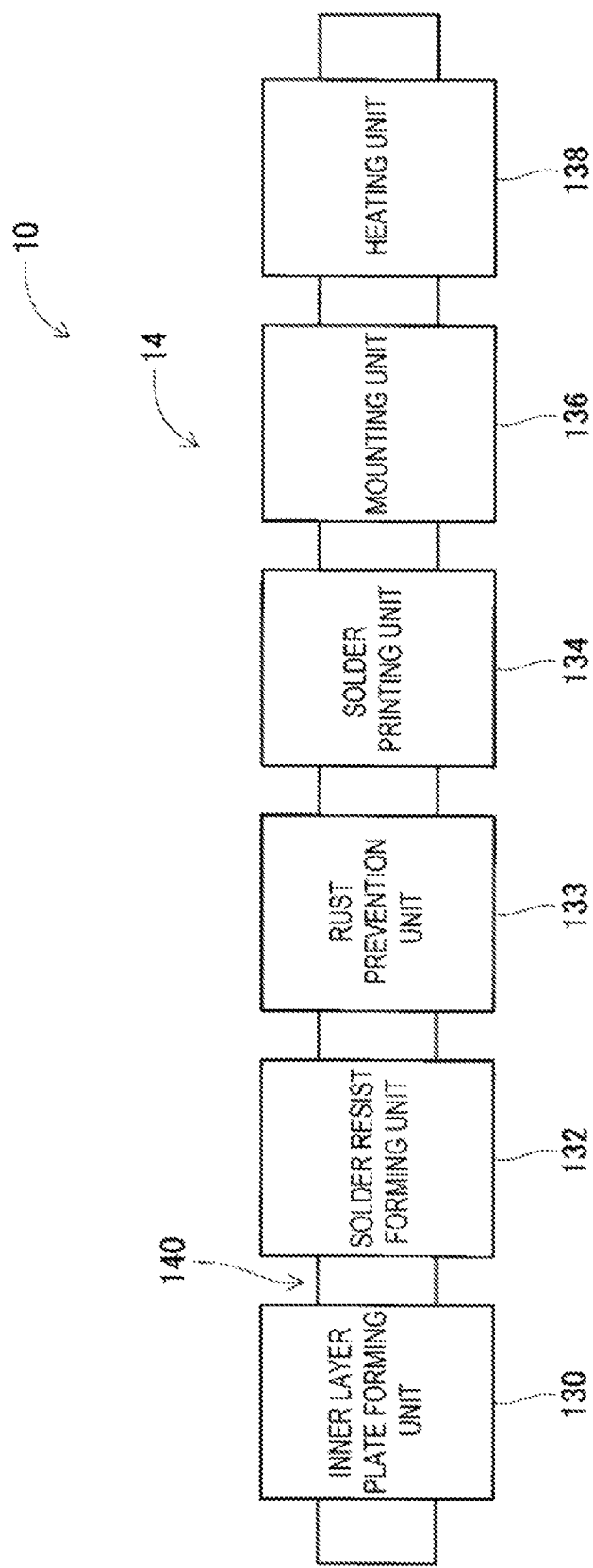
FIG. 3 is a diagram illustrating a general-purpose section forming device.

In addition, general-purpose section forming device 14 is a general printed substrate manufacturing device, and includes inner layer plate forming unit 130, solder resist forming unit 132, rust prevention unit 133, solder printing unit 134, mounting unit 136, heating unit 138, and conveyor device 140 as illustrated in FIG. 3.

Inner layer plate forming unit 130 is a unit that forms inner layer plate (refer to FIG. 4) 150, and forms inner layer plate 150 using a pressure-boding device (not illustrated), a photosensitive device (not illustrated), a surface treatment device (not illustrated), and the like. Specifically, for example, in an inner layer pattern forming method of a subtract method, a copper foil is pressure-bonded to insulating layer (refer to FIG. 4) 152 such as an interlayer material or a prepreg by the pressure-boding device. At this time, since an unevenness is formed on the pressure-bonded surface of the copper foil, an unevenness is formed on the pressure-bonded surface of insulating layer 152. Then, a photosensitive mask resist on the copper foil is exposed by the photosensitive device in accordance with the wiring pattern and developed. Subsequently, the unnecessary copper foil is etched. As a result, inner layer plate 150 configured to include insulating layer 152 and copper pattern (refer to FIG. 4) 154 is formed.

In addition, for example, in a semi-additive inner layer pattern forming method, unevenness is formed on a top surface of insulating layer 152 by a surface treatment device. As a method of forming the unevenness on the top surface of insulating layer 152, there is a method in which the surface of insulating layer 152 is chemically roughened with potassium permanganate or the like to form the unevenness, or a method in which the top surface of insulating layer 152 is physically roughened by blasting or the like to form the unevenness. Then, by an electrolysis plating process, a copper thin film is formed on the surface of insulating layer 152 on which the unevenness is formed. Furthermore, a plating resist is formed on the top surface of the copper thin film along the wiring pattern, and then, electrolytic plating process is performed. As a result, the copper plating is deposited on the places where the plating resist is not formed. Then, by removing the plating resist and etching the copper thin film, inner layer plate 150 composed of insulating layer 152 and copper pattern 154 is formed.

In addition, solder resist forming unit 132 is a unit that forms solder resist (refer to FIG. 5) 160 on the top surface of inner layer plate 150, and forms solder resist 160 by a printing device (not illustrated), the irradiation device (not illustrated), or the like. Specifically, an exposure mask (not illustrated) is brought into close contact with the top surface of inner layer plate 150, and the UV curable resin is printed on the exposure mask by the printing device. A through-hole is formed on the exposure mask so that a portion of copper pattern 154 other than pad (refer to FIG. 5) 162 is exposed, the UV curable resin is irradiated with ultraviolet rays by the irradiation device through the exposure mask so that the UV curable resin is cured, and in the subsequent development step, the unexposed solder resist on pad 162 is dissolved, so that solder resist 160 is formed on the top surface of inner layer plate 150 in a state where pad 162 exposed. When a positive solder resist is used, the mask design of the exposed part and the unexposed part is negative-positive reversed.

In addition, rust prevention unit 133 is a unit for preventing the rust on pad 162 of copper pattern 154, and prevent the rust on pad 162 with a palladium removing device (not illustrated), a plating device (not illustrated), or the like. Specifically, first, a palladium removing process is performed on the top surface of inner layer plate 150 on which solder resist 160 is formed. This is because the metal catalyst used in the pre-process remains on the top surface of inner layer plate 150. Then, after the palladium removing process, inner layer plate 150 having solder resist 160 formed thereon is subjected to the electrolysis nickel-gold plating process in the plating device. As a result, pad 162 is covered with nickel-gold plating (refer to FIG. 6) 166.

In addition, solder printing unit 134 is a unit that prints solder on the opening of solder resist 160, that is, pad 162 exposed from solder resist 160, and the solder is printed on pad 162 by the printing device (not illustrated). Specifically, a solder mask (not illustrated) is brought into close contact with the top surface of solder resist 160, and the solder paste is printed on the solder mask by a printing device. The through-hole is formed on the solder mask so that pad 162 of copper pattern 154 is exposed, and solder paste (refer to FIG. 7) 168 is printed on the upper surface of pad 162 covered with nickel-gold plating 166.

Mounting unit 136 is a unit for mounting electronic components (refer to FIG. 13) 170 on the upper surface of solder resist 160, and mounts electronic components 170 using a tape feeder (not illustrated), a mounting head (not illustrated), and a movement device (not illustrated). Specifically, the tape feeder, the mounting head, and the movement device included in mounting unit 136 are the same as tape feeder 110, mounting head 112, and movement device 114 included in mounting unit 26 of custom section forming device 12. Therefore, in mounting unit 136, electronic component 170 supplied from the tape feeder is held by the suction nozzle, and electronic component 170 held by the suction nozzle is mounted on the upper surface of solder resist 160. At this time, electronic component 170 is mounted on the upper surface of solder resist 160 so that electrode 172 of electronic component 170 comes in contact with solder paste 168 discharged on the upper surface of pad 162.

Heating unit 138 is a unit for heating solder paste 168, and solder paste 168 is heated by a reflow furnace or the like. As a result, electronic component 170 is fixedly mounted on the upper surface of solder resist 160 in a state of being electrically connected to copper pattern 154 of inner layer plate 150.

Conveyor device 140 is a device that conveys the printed substrate in an order of inner layer plate forming unit 130, solder resist forming unit 132, rust prevention unit 133, solder printing unit 134, mounting unit 136, and heating unit 138. As a result, the printed substrate is manufactured by the work in each unit.

In circuit forming system 10, by the above-described configuration, in a predetermined region (hereinafter, referred to as a "general-purpose region"), a printed substrate forming step is performed by general-purpose section forming device 14. In addition, in a region different from the general-purpose region (hereinafter referred to as a "custom region"), the printed substrate forming step is performed by custom section forming device 12.

Figure 4:
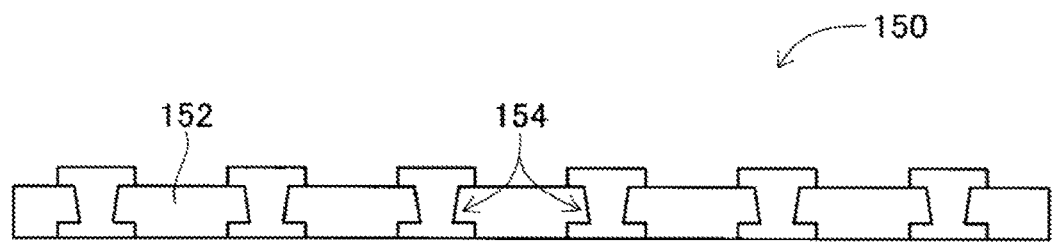
FIG. 4 is a sectional view illustrating an inner layer plate.
Figure 5:
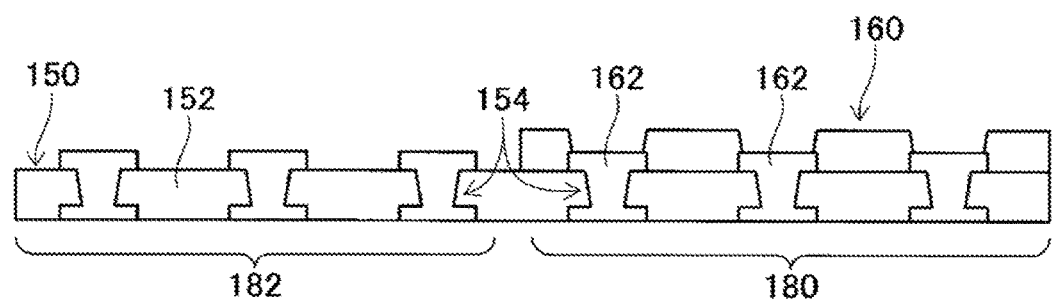
FIG. 5 is a sectional view illustrating an inner layer plate in which a solder resist is formed on a general-purpose region.

Specifically, first, in inner layer plate forming unit 130 of general-purpose section forming device 14, inner layer plate 150 illustrated in FIG. 4 is formed. Next, formed inner layer plate 150 is conveyed into solder resist forming unit 132 by conveyor device 140. Then, in solder resist forming unit 132, as illustrated in FIG. 5, solder resist 160 is formed only on general-purpose region 180 of inner layer plate 150. In the exposure mask used when forming the solder resist, the through-hole is not formed on the portion covering custom region 182, and the resin for the solder resist is not exposed in custom region 182. When a positive solder resist is used, the mask design of the exposed part and the unexposed part is negative-positive reversed.

Figure 6:
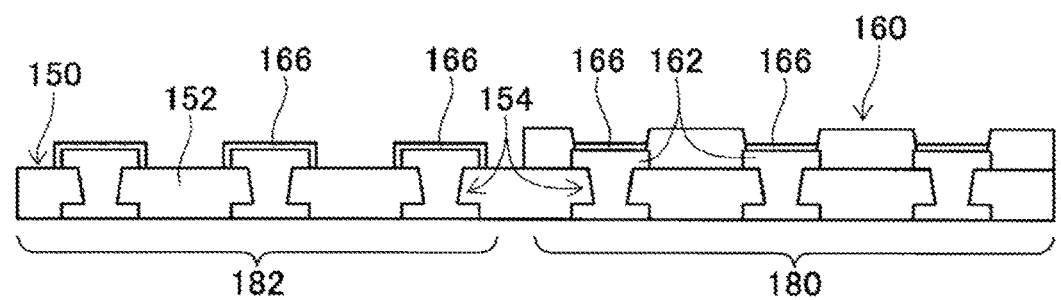
FIG. 6 is a sectional view illustrating an inner layer plate in which a nickel-gold plating is formed on a top surface of the solder resist.

Subsequently, when solder resist 160 is formed, inner layer plate 150 is conveyed into rust prevention unit 133 by conveyor device 140. Then, in rust prevention unit 133, the nickel-gold plating process is performed after the palladium removing process is performed. As a result, as illustrated in FIG. 6, in general-purpose region 180, pad 162 exposed from solder resist 160 is covered with nickel-gold plating 166. In addition, in custom region 182 also, pad 162 exposed from insulating layer 152 is covered with nickel-gold plating 166.

Figure 7:
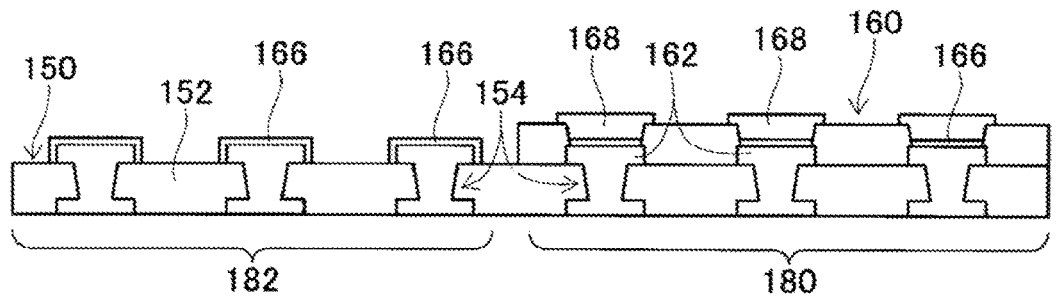
FIG. 7 is a sectional view illustrating an inner layer plate in which solder paste is printed.

Next, when pad 162 is covered with nickel-gold plating 166, inner layer plate 150 is conveyed into solder printing unit 134 by conveyor device 140. Then, as illustrated in FIG. 7, in solder printing unit 134, solder paste 168 is printed on the opening of solder resist 160 formed on general-purpose region 180, that is, the upper surface of pad 162 exposed from solder resist 160. In the solder mask used for printing the solder paste, the through-hole is not formed on the portion covering custom region 182, and solder paste 168 is not printed in custom region 182.

Figure 8:
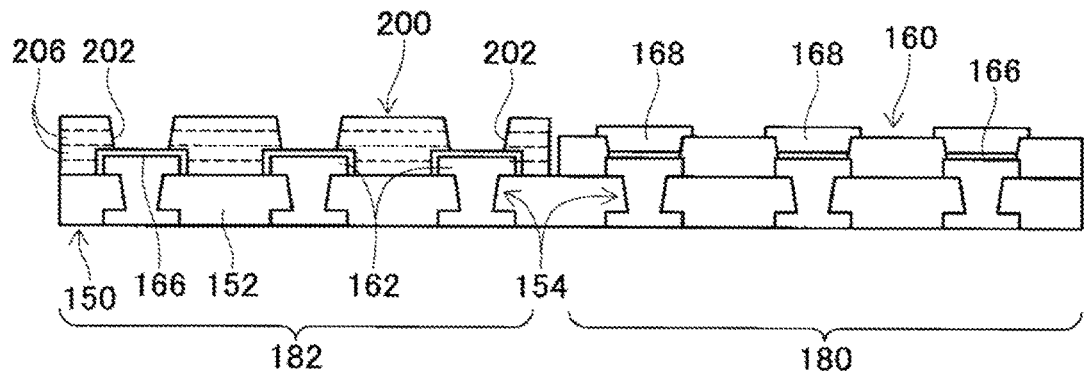
FIG. 8 is a sectional view illustrating an inner layer plate in which a resin layer is formed on a custom region.

Subsequently, when the printing of solder paste 168 is completed, inner layer plate 150 on which solder paste 168 is printed is taken out from general-purpose section forming device 14. Then, in custom section forming device 12, inner layer plate 150 is set on base plate 60 of stage 52, and stage 52 is moved below second shaping unit 24. In second shaping unit 24, as illustrated in FIG. 8, resin layer 200 is formed on the upper surface of inner layer plate 150 in custom region 182. The resin layer 200 includes opening 202 for exposing pad 162 of inner layer plate 150, and is formed by repeatedly performing the discharging of the UV curable resin from inkjet head 88 and the discharged UV curable resin being irradiated with the ultraviolet rays emitted by irradiation device 92.

Specifically, in second printing section 84 of second shaping unit 24, inkjet head 88 discharges the UV curable resin in a thin film shape on the upper surface of inner layer plate 150 in custom region 182. At this time, inkjet head 88 discharges the UV curable resin so that the upper surface of pad 162 of inner layer plate 150 is exposed. Subsequently, when the UV curable resin is discharged in a thin film shape, in curing section 86, irradiation device 92 causes the thin film shaped UV curable resin to be irradiated with the ultraviolet rays. As a result, thin film 206 is formed on the upper surface of inner layer plate 150.

Subsequently, inkjet head 88 discharges the UV curable resin only in the upper portion of thin film 206 in a thin film shape. That is, inkjet head 88 discharges the UV curable resin on thin film 206 in a thin film shape so that pad 162 of inner layer plate 150 is exposed. Then, by the UV curable resin discharged in the thin film shape is irradiated with the ultraviolet rays by irradiation device 92, thin film 206 is laminated on thin film 206. In this way, by repeatedly performing the discharging of the UV curable resin on thin film 206 excluding pad 162 and the irradiation with the ultraviolet rays, and the multiple thin films 206 are laminated, resin layer 200 having opening 202 is formed. When the thin films are laminated, the UV curable resin discharged on thin films 206 slightly flows into openings 202. Therefore, an inner wall surface that defines opening 202 is an inclined surface.

By the way, when thin film 206 on the upper end surface of resin layer 200 is formed, thin film 206 becomes a flat surface by flattening device 90. Specifically, when forming thin film 206 on the upper end surface of resin layer 200, when inkjet head 88 discharges the UV curable resin in the thin film shape, the UV curable resin is flattened by flattening device 90 so that the discharged UV curable resin has a uniform film thickness. Then, the flattened UV curable resin is irradiated with ultraviolet rays by irradiation device 92. As a result, the upper end surface of resin layer 200 becomes a flat surface.

In flattening device 90, the UV curable resin is flattened by rollers or the like, however, when the flattened UV curable resin is positioned below the maximum height in general-purpose region 180, the rollers or the like and the upper end part of general-purpose region 180 interfere with each other. Therefore, resin layer 200 is formed such that the upper end surface of resin layer 200 is higher than the maximum height in general-purpose region 180 when resin layer 200 is formed. That is, resin layer 200 is formed such that the upper end surface of resin layer 200 is higher than the upper end surface of solder paste 168 of general-purpose region 180. In this way, a proper operation of the roller can be ensured.

Figure 9:
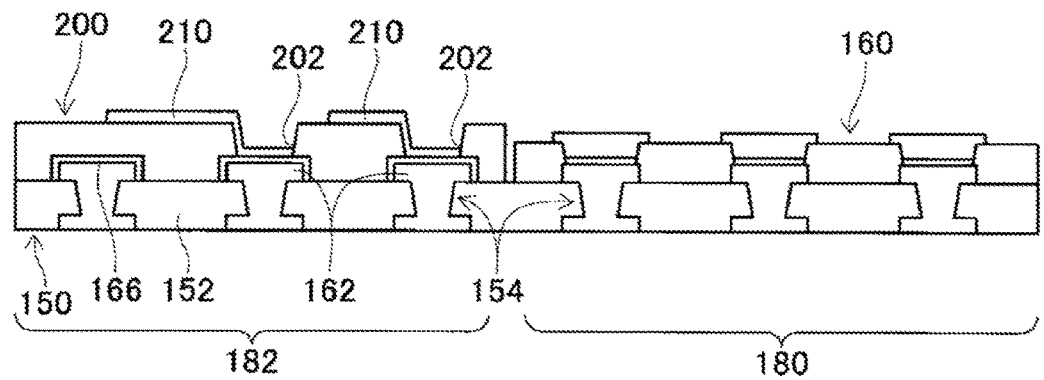
FIG. 9 is a sectional view illustrating an inner layer plate in which a wiring is formed on a top surface of the resin layer.

Next, when resin layer 200 is formed, stage 52 is moved below first shaping unit 22. Then, in first printing section 72, inkjet head 76 discharges the metal ink in a line shape to the inner part of opening 202 of resin layer 200, that is, from pad 162 exposed to opening 202 up to upper surface of opening 202 via the inner wall surface of opening 202. Next, in firing section 74, laser irradiation device 78 irradiates the metal ink with laser light. At this time, the energy of the laser light is absorbed by the metal ink, and thus, the metal ink generates heat and is fired. As a result, as illustrated in FIG. 9, wiring 210 is formed from pad 162 exposed to opening 202 up to the upper surface of opening 202 via the inner wall surface of opening 202. In addition, the ink fire may be performed by a collective heating method at a temperature at which necessary energy can be applied without using a laser.

Figure 10:
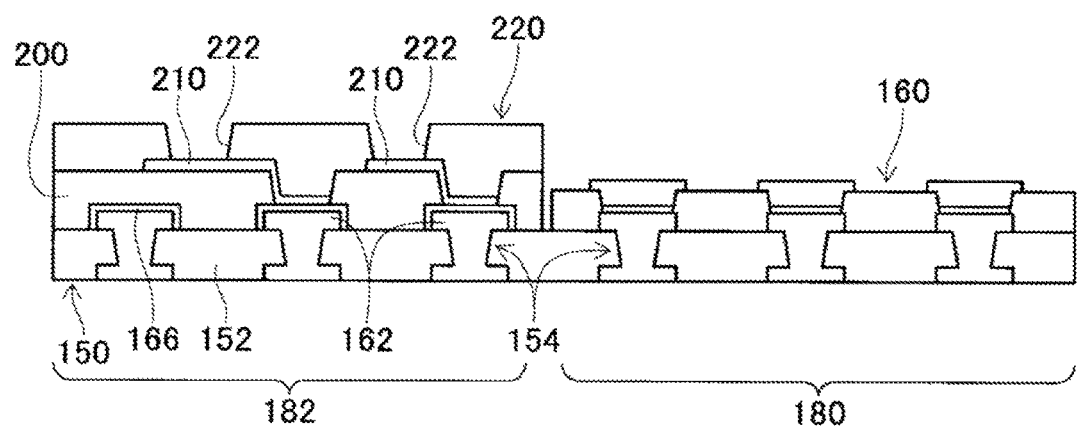
FIG. 10 is a sectional view illustrating an inner layer plate in which a resin layer covering the wiring is formed.

Subsequently, when wiring 210 is formed, stage 52 is moved below second shaping unit 24. In second shaping unit 24, as illustrated in FIG. 10, resin layer 220 is formed so as to cover the inner part of opening 202 and resin layer 200. In this resin layer 220, opening 222 is formed so that a part of wiring 210 formed on the upper surface of resin layer 200 is exposed. Similarly to resin layer 200, resin layer 220 is formed by repeatedly performing the discharging of the UV curable resin by inkjet head 88 and the irradiation with the ultraviolet rays by irradiation device 92.

Figure 11:
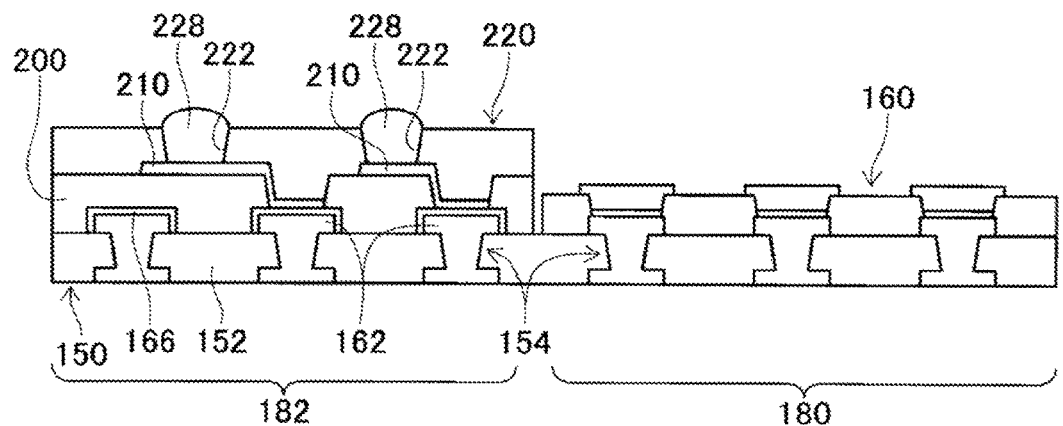
FIG. 11 is a sectional view illustrating an inner layer plate on which a conductive UV curable resin is discharged.

Next, when resin layer 220 is formed, in discharge section 85 of second shaping unit 24, as illustrated in FIG. 11, dispense head 89 discharges conductive UV curable resin 228 to the inner part of opening 222 of resin layer 220, that is, the upper surface of wiring 210 exposed via the opening 222. At this time, dispense head 89 discharges conductive UV curable resin 228 so that the inner part of opening 222 is filled with conductive UV curable resin 228 and conductive UV curable resin 228 protrudes upward from the opening at the upper end of opening 222. Then, by conductive UV curable resin 228 being irradiated with the ultraviolet rays by irradiation device 92, conductive UV curable resin 228 exhibits the conductivity. Here, a conductive thermosetting resin may be used instead of conductive UV curable resin. Instead of the dispenser, other printing methods such as a stamp may be used.

Figure 12:
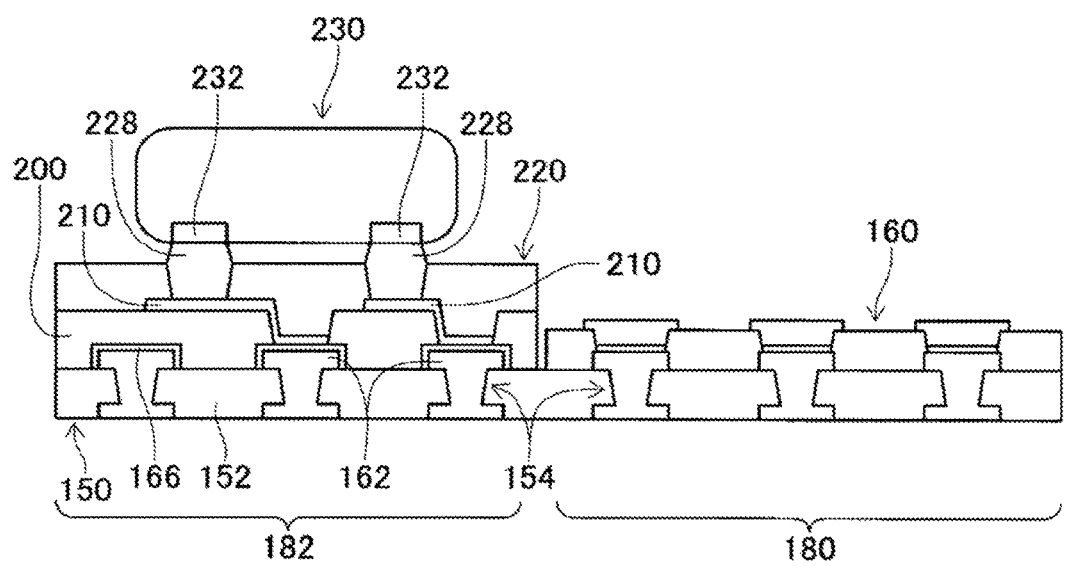
FIG. 12 is a sectional view illustrating an inner layer plate on which electronic components are mounted on the resin layer.

Subsequently, stage 52 is moved to mounting unit 26. In mounting unit 26, electronic component (refer to FIG. 12) 230 is supplied by tape feeder 110, and mounting head 112 holds electronic component 230. Then, as illustrated in FIG. 12, by the operation of movement device 114, electronic component 230 held by mounting head 112 is mounted on the upper surface of resin layer 220. At this time, electronic component 230 is mounted on the upper surface of resin layer 220 so that electrode 232 of electronic component 230 comes in contact with conductive UV curable resin 228 discharged to opening 222 of resin layer 220. In this way, electronic component 230 is fixedly mounted on the upper surface of resin layer 220 in a state of being electrically connected to pad 162 of inner layer plate 150, that is, copper pattern 154, via nickel-gold plating 166, wiring 210, and conductive UV curable resin 228.

In addition, when electronic component 230 is mounted on the upper surface of resin layer 220, inner layer plate 150 on which electronic component 230 is mounted is taken out from the custom section forming device 12. Then, in general-purpose section forming device 14, inner layer plate 150 on which electronic component 230 is mounted is conveyed into mounting unit 136 by conveyance device 20.

Figure 13:
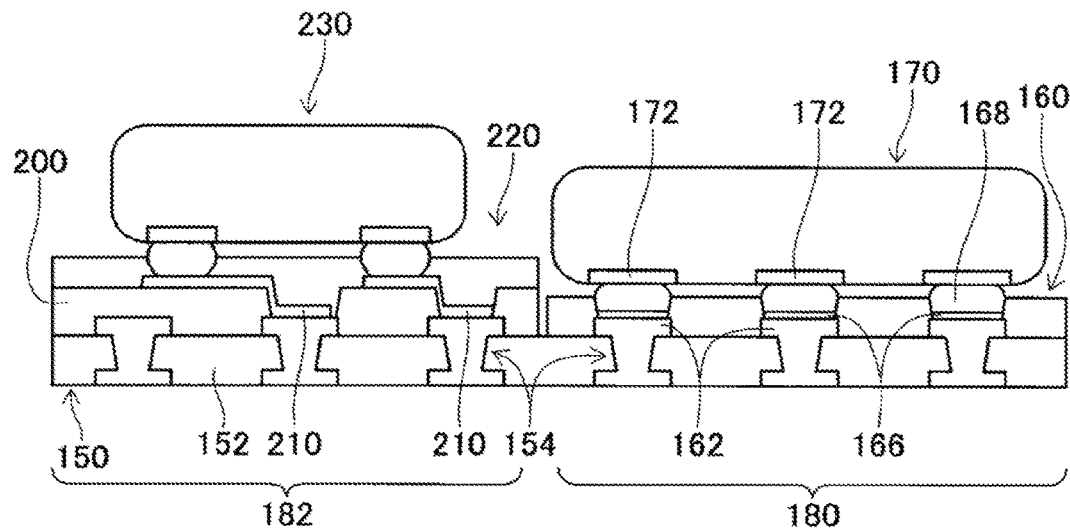
FIG. 13 is a sectional view illustrating an inner layer plate on which the electronic components are mounted to the solder resist.

In mounting unit 136, electronic component 170 supplied from tape feeder is held by suction nozzle, and electronic component 170 held by the suction nozzle is mounted on the upper surface of solder resist 160 as illustrated in FIG. 13. At this time, electronic component 170 is mounted on the upper surface of solder resist 160 so that electrode 172 of electronic component 170 comes in contact with solder paste 168 discharged on the upper surface of pad 162.

Subsequently, inner layer plate 150 on which electronic component 170 is mounted on the upper surface of solder resist 160 is conveyed into heating unit 138 by conveyor device 140. Then, heating unit 138 is heated by a reflow furnace. As a result, electronic component 170 is fixedly mounted on the upper surface of solder resist 160 in a state of being electrically connected to copper pattern 154 of inner layer plate 150 via nickel-gold plating 166 and solder paste 168.

As described above, in circuit forming system 10, resin layers 200 and 220, wiring 210, and the like are formed on custom region 182 by custom section forming device 12, and electronic component 230 is mounted on the upper surface of resin layer 220. In addition, in general-purpose region 180, solder resist 160 and the like are formed by general-purpose section forming device 14, and electronic component 170 is mounted on the upper surface of solder resist 160. That is, in general-purpose region 180, the board is formed according to a general method of manufacturing a printer substrate, and in custom region 182, the board is formed according to the method of manufacturing a printer board using the 3D printer. As a result, it is possible to manufacture the printed substrate by taking advantages of each of the method of manufacturing the general printer board and the method of manufacturing the printer board using the 3D printer.

Specifically, in the method of manufacturing the general printed substrate, the printed substrate is manufactured using the exposure mask, or the like, therefore, the printed substrates having the circuit patterns according to the exposure masks or the like can be manufactured in large quantities, and thus, the productivity can be improved, and it is advantageous in terms of cost. On the other hand, if it is desired to change the manufacturing conditions of only a part of inner layer plate 150, it is needed to create a new exposure mask, and thus, considering the mask creation cost, the mask creation period, and the like, the customizability and on-demand performance are low.

In addition, in the method of manufacturing the printed substrate using 3D printer, the circuit pattern can be changed only by changing a program that controls the operation of inkjet head 88 or the like, and it is possible to easily change the manufacturing conditions of only a part of one inner layer plate 150. Therefore, in the method of manufacturing the printed substrate using the 3D printer, the customizability and the on-demand performance are extremely high. However, resin layers 200 and 220 formed of UV curable resin are immature as the materials for the printed substrates from a viewpoint of expansion coefficient, hardness, and the like, and the resistivity and thickness of wiring 210 formed by metal-containing liquid are inferior in resistivity, thickness, or the like of the wiring by the copper plating. In addition, in the method of manufacturing the printed substrate using the 3D printer, compared to a general method of manufacturing the printed substrate, the productivity is low and the cost required for UV curable resin, metal-containing liquid, and the like is disadvantageous in terms of cost.

In view of above description, in circuit forming system 10, a general-purpose portion of the printed substrate is manufactured by a general method of manufacturing the printed substrate, that is, by general-purpose section forming device 14, and a highly customizable portion of the printed substrate is manufactured by the method of manufacturing the printed substrate using the 3D printer, that is, by custom section forming device 12.

Specifically, for example, in the printer board used for wearable devices, the power supply section, the control section, the output section, and the like are general-purpose portion and are manufactured by general-purpose section forming device 14. On the other hand, a sensing section for detecting a predetermined detection value is manufactured by custom section forming device 12 because the customizability is high differently from that of the wearable devices according to the purpose.

That is, in the general-purpose portion such as the power supply section and the control section, the manufacturing step is performed on general-purpose region 180 described above, and in a high-customizability portion such as the antenna pattern and the sensing section, the manufacturing step for custom region 182 is performed. In this way, it is possible to manufacture the printed substrate by taking advantage of each of the method of manufacturing the general printer board and the method of manufacturing the printer board using the 3D printer, and for example, it is possible to appropriately deal with the manufacturing of various kinds in small quantity of printed substrates.

In addition, in circuit forming system 10, when inner layer plate 150 is formed on inner layer plate forming unit 130 of general-purpose section forming device 14, unevennesses are formed on the upper surface of insulating layer 152. In second shaping unit 24 of custom section forming device 12, resin layer 200 is formed on the upper surface of insulating layer 152 on which the unevennesses are formed. As a result, the adhesion between insulating layer 152 and resin layer 200 is increased, and the strength and reliability of the printed substrate are ensured.

In addition, in rust prevention unit 133 of general-purpose section forming device 14, after the palladium removing process is performed, the nickel-gold plating process is performed, and pad 162 of copper pattern 154 is covered with nickel-gold plating 166. Therefore, nickel-gold plating 166 is formed only on pad 162 of inner layer plate 150, and it is possible to prevent nickel-gold plating 166 from being formed on insulating layer 152. As a result, pad 162 can be appropriately rust-prevented by nickel-gold plating 166, and the conductivity of the conductive section is ensured.

In the embodiment described above, in solder printing unit 134 of general-purpose section forming device 14, solder paste 168 is printed on the upper surface of pad 162 using the solder mask, but solder paste 168 may be discharged on the upper surface of pad 162 by a dispenser head or the like. In such a case, not before resin layer 200 is formed on custom region 182 but after resin layer 200 is formed, solder paste 168 may be discharged on the upper surface of pad 162. In addition, if solder paste 168 is discharged on the upper surface of pad 162 after resin layer 200 is formed, the maximum height of general-purpose region 180 when resin layer 200 is formed is the upper surface of solder resist 160. Therefore, resin layer 200 is formed such that the upper end surface of resin layer 200 becomes higher than the upper end surface of solder resist 160 of general-purpose region 180.

Figure 14:
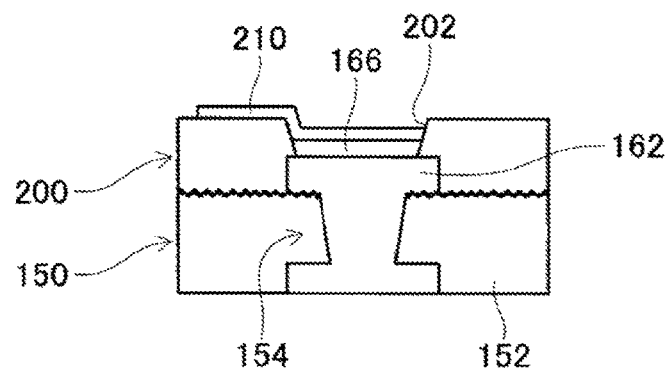
FIG. 14 is a sectional view illustrating a part of a printed substrate in a custom region in a first modification example.

In addition, in the embodiment described above, the nickel-gold plating process is performed before resin layer 200 is formed, but the nickel-gold plating process may be performed after resin layer 200 is formed. In such a case, as illustrated in FIG. 14, nickel-gold plating 166 is formed only on the upper surface of pad 162 exposed from opening 202 of resin layer 200. As described above, by performing the nickel-gold plating process after resin layer 200 is formed, it becomes possible to omit the palladium removing process in rust prevention unit 133. This is because the top surface of insulating layer 152, which is the target of the palladium removing process, is covered with resin layer 200.

Figure 15:
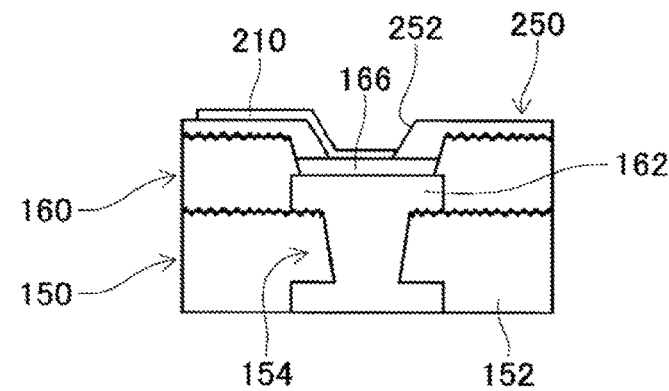
FIG. 15 is a sectional view illustrating a part of a printed substrate in a custom region in a second modification example.

In addition, in the embodiment described above, solder resist 160 is formed only in general-purpose region 180 and not in custom region 182, but solder resist 160 may be formed on both general-purpose region 180 and custom region 182. In such a case, in custom region 182, as illustrated in FIG. 15, resin layer 250 is formed on the upper surface of solder resist 160. At this time, opening 252 is formed on resin layer 250 so that the upper surface of nickel-gold plating 166 covering pad 162 is exposed. Resin layer 250 is formed by the same method as resin layer 200. As described above, by forming solder resist 160 in custom region 182 and forming resin layer 250 on the upper surface of solder resist 160, resin layer 250 can be thinned. As a result, it is possible to shorten the formation time of resin layer 250.

Incidentally, the unevenness is formed on the top surface of solder resist 160 on which resin layer 250 is formed. As a result, the adhesion between resin layer 250 and solder resist 160 can be improved. As a method of forming unevenness on the top surface of solder resist 160, there is a method in which the surface of solder resist 160 is chemically roughened with potassium permanganate or the like to form unevenness, a method in which the surface of solder resist 160 is physically roughened by blasting or the like to form the unevenness. In addition, by increasing the wettability of the top surface of solder resist 160, the adhesion between resin layer 250 and solder resist 160 can be increased. As a method for increasing the wettability of the top surface of solder resist 160, there is a method in which plasma treatment is performed on the top surface of solder resist 160.

In addition, in the embodiment described above, the nickel-gold plating process is performed to prevent pad 162 from rust, but rust preventing process other than the nickel-gold plating process can be used. Specifically, for example, nickel-palladium-gold plating process, organic solderability preservative (OSP) process, or the like can be adopted.

Incidentally, in the embodiment described above, custom section forming device 12 is an example of the printed substrate forming device. First shaping unit 22 is an example of a wiring forming device. Second shaping unit 24 is an example of the resin layer forming device. Inner layer plate 150 is an example of the base. Insulating layer 152 is an example of the insulating layer. Copper pattern 154 is an example of the conductor layer. Solder resist 160 is an example of the solder resist. Pad 162 is an example of the conduction section. Resin layer 200 is an example of the resin layer. Opening 202 is an example of the opening section. Wiring 210 is an example of the wiring. The step performed by first shaping unit 22 is an example of the wiring forming step. The step performed by second shaping unit 24 is an example of the resin layer forming step. The step performed by rust prevention unit 133 is an example of the rust prevention step and the unevenness forming step. The step of forming the unevenness on the top surface of solder resist 160 and the step of improving the wettability of the top surface of solder resist 160 are examples of the surface treatment step.

The present disclosure is not limited to the embodiment described above, and can be embodied in various aspects with various modifications and improvements based on the knowledge of those skilled in the art. For example, in the embodiment described above, circuit forming system 10 is configured with two devices, custom section forming device 12 and general-purpose section forming device 14, but may be configured by one device having both the function of custom section forming device 12 and the function of general-purpose section forming device 14.

REFERENCE SIGNS LIST

12: custom section forming device (printed substrate forming device), 22: first shaping unit (wiring forming device), 24: second shaping unit (resin layer forming device), 150: inner layer plate (base), 152: insulating layer, 154: copper pattern (conductor layer), 160: solder resist, 162: pad (conduction section), 200: resin layer, 202: opening (opening section), 210: wiring

The invention claimed is:

1. A printed substrate forming method comprising:
   a resin layer forming step of forming a resin layer with curable resin in a first region that is a region other than a second region of a base which is composed of an insulating layer and a conductor layer, the second region of which being a region on which a solder resist is formed; and
   a wiring forming step of forming a wiring by discharging metal-containing liquid which contains metal particles onto a top surface of the resin layer, and firing the metal-containing liquid.

2. The printed substrate forming method according to claim 1,
   wherein the resin layer forming step is a step of forming the resin layer having an opening section and exposing a conduction section of the conductor layer via the opening section, and
   includes a rust prevention step of preventing a rust by performing any one of a nickel-gold plating process, a nickel-palladium-gold plating process, and an OSP process on the conduction section.

3. The printed substrate forming method according to claim 1, further comprising:
   an unevenness forming step of forming an unevenness on the top surface of the base in the first region before the resin layer is formed,
   wherein the resin layer forming step is a step of forming the resin layer on the top surface of the base on which the unevenness is formed on the unevenness forming step.

4. The printed substrate forming method according to claim 1,
   wherein the solder resist is also formed on the first region of the base, and the resin layer forming step is a step of forming the resin layer on the top surface of the solder resist formed on the first region.

5. The printed substrate forming method according to claim 4, further comprising:
   a surface treatment step of performing at least one of a process for forming an unevenness on the top surface of the solder resist formed on the first region, and a process for increasing a wettability of the top surface of the solder resist formed on the first region before the resin layer is formed,
wherein the resin layer forming step is a step of forming the resin layer on the top surface of the solder resist on which the treatment is performed on the surface treatment step.

6. The printed substrate forming method according to claim 1,
wherein the resin layer forming step is a step of forming the resin layer with an upper end surface of the resin layer is higher than a maximum height in the second region when the resin layer is formed.

* * * * *